(12) United States Patent
Park et al.

(10) Patent No.: US 9,502,308 B1
(45) Date of Patent: Nov. 22, 2016

(54) METHODS FOR FORMING TRANSISTOR DEVICES WITH DIFFERENT SOURCE/DRAIN CONTACT LINERS AND THE RESULTING DEVICES

(71) Applicant: GLOBALFOUNDRIES Inc., Grand Cayman (KY)

(72) Inventors: Chanro Park, Clifton Park, NY (US); Hoon Kim, Clifton Park, NY (US); Ruilong Xie, Niskayuna, NY (US); Min Gyu Sung, Latham, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/944,659

(22) Filed: Nov. 18, 2015

(51) Int. Cl.
| | |
|---|---|
| H01L 21/70 | (2006.01) |
| H01L 21/8238 | (2006.01) |
| H01L 21/768 | (2006.01) |
| H01L 27/092 | (2006.01) |
| H01L 23/535 | (2006.01) |
| H01L 23/532 | (2006.01) |

(52) U.S. Cl.
CPC . H01L 21/823871 (2013.01); H01L 21/76805 (2013.01); H01L 21/76843 (2013.01); H01L 21/76895 (2013.01); H01L 23/535 (2013.01); H01L 23/53266 (2013.01); H01L 27/0924 (2013.01)

(58) Field of Classification Search
CPC ............... H01L 21/823871; H01L 21/76805; H01L 21/76843; H01L 21/76895; H01L 23/53266; H01L 23/535
See application file for complete search history.

(56) References Cited

U.S. PATENT DOCUMENTS

| | | | |
|---|---|---|---|
| 7,655,547 B2 * | 2/2010 | Cooney, III | ...... H01L 21/76808 257/E21.575 |
| 2013/0299922 A1 * | 11/2013 | Choi | ................. H01L 21/82345 257/412 |

* cited by examiner

*Primary Examiner* — Dale E Page
*Assistant Examiner* — Wasiul Haider
(74) *Attorney, Agent, or Firm* — Amerson Law Firm, PLLC

(57) ABSTRACT

A method includes forming first and second contact openings so as to expose first and second source/drain regions, respectively, of a semiconductor material. At least one process operation is performed to selectively form a first liner only in the first contact opening. The first liner covers a bottom portion of the first contact opening and exposes a sidewall portion of the first contact opening. A second liner is formed in the first and second contact openings. At least one process operation is performed so as to form a conductive material above the second liner to fill the first and second contact openings and define first and second contacts conductively coupled to the first and second source/drain regions, respectively.

20 Claims, 10 Drawing Sheets

METHODS FOR FORMING TRANSISTOR DEVICES WITH DIFFERENT SOURCE/DRAIN CONTACT LINERS AND THE RESULTING DEVICES

BACKGROUND OF THE INVENTION

1. Field of the Invention

The present disclosure generally relates to the fabrication of semiconductor devices, and, more particularly, to methods for forming transistor devices with different source/drain contact liners and the resulting devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

FIG. 1A is a perspective view of an illustrative prior art FinFET semiconductor device 100 that is formed above a semiconductor substrate 105 at an intermediate point during fabrication. In this example, the FinFET device 100 includes three illustrative fins 110, an isolation material 130, a gate structure 115, sidewall spacers 120 and a gate cap layer 125. The fins 110 have a three-dimensional configuration: a height, a width, and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

In an integrated circuit device, there are different performance requirements for different functional blocks or regions of the device, i.e., there may be different performance specifications for devices formed in a logic region as compared to devices formed for input/output circuitry or in a memory region. It is useful to provide different materials for the source/drain contacts for the NMOS and PMOS transistors. Generally, different materials are optimal for the different type transistor devices. However, providing different materials in the different regions significantly complicates the process flow. For example, it is common to selectively form a first liner for a first type of device (i.e., PMOS or NMOS) only in a first contact opening for the first device, form a second liner for the second type of device in the first and second contact openings of both devices, and fill the remainder of the first and second contact openings with a conductive material. Because the first contact opening for the first type of device includes two liners, while the second contact opening only has a single liner (i.e., the second liner), the aspect ratio of the first contact opening is reduced relative to the aspect ratio of the second contact opening. Accordingly, there is a reduced amount of the conductive material in the first contact opening as compared to the second contact opening and a corresponding increased contact resistance for the first contact formed in the first contact opening as compared to the second contact formed in the second contact opening.

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor devices. A method includes forming first and second contact openings so as to expose first and second source/drain regions, respectively, of a semiconductor material. At least one process operation is performed to selectively form a first liner only in the first contact opening. The first liner covers a bottom portion of the first contact opening and exposes a sidewall portion of the first contact opening. A second liner is formed in the first and second contact openings. At least one process operation is performed so as to form a conductive material above the second liner to fill the first and second contact openings and define first and second contacts conductively coupled to the first and second source/drain regions, respectively.

Another illustrative method disclosed herein includes, among other things, forming first and second contact openings so as to expose first and second source/drain regions, respectively, of a semiconductor material. A first liner is formed in the first and second contact openings. The first liner is removed from the second contact opening and a top portion of the first liner is removed from the first contact opening to define a remainder portion of the first liner covering a bottom portion of the first contact opening. A second liner is formed in the first and second contact openings. The second liner is disposed above the remainder portion of the first liner in the first contact opening. A conductive material is formed above the second liner to fill the first and second contact openings and define first and second contacts conductively coupled to the first and second source/drain regions, respectively.

One illustrative device disclosed herein includes, among other things, a first contact conductively coupled to a first source/drain region. The first contact includes a first liner disposed above the first source drain region and having a height less than a height of the contact, a first portion of a second liner disposed above the first liner, and a first portion of a conductive material disposed above the first portion of the second liner. A second contact conductively coupled to a second source/drain region includes a second portion of the second liner disposed above the second source/drain region and a second portion of the conductive material disposed above the second portion of the second liner.

BRIEF DESCRIPTION OF THE DRAWINGS

The disclosure may be understood by reference to the following description taken in conjunction with the accompanying drawings, in which like reference numerals identify like elements, and in which.

Figure 1:
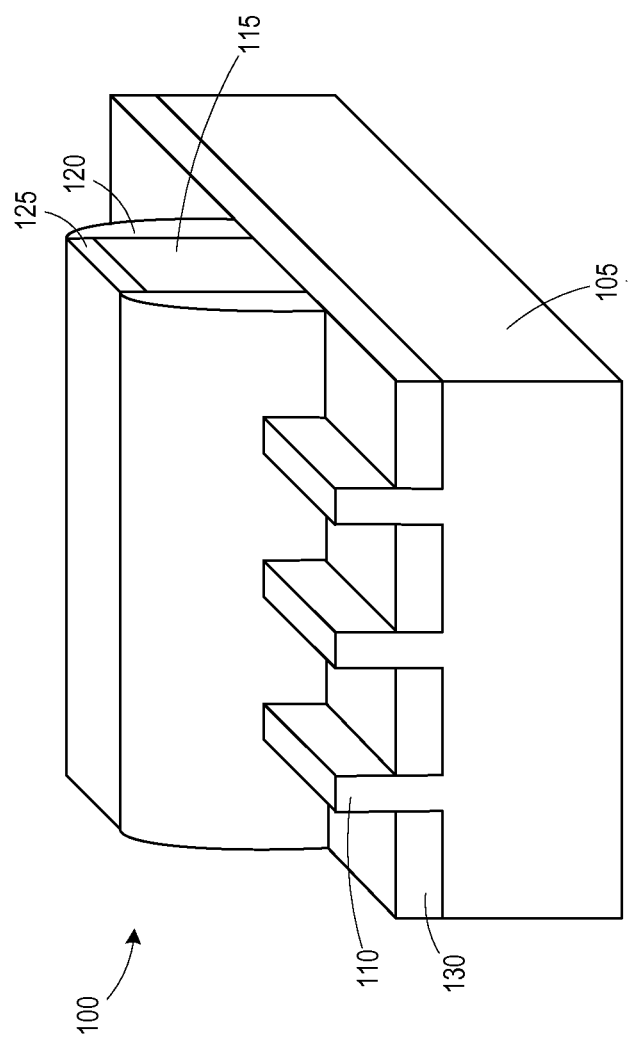
FIG. 1 schematically depicts an illustrative prior art FinFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming transistor devices with different source/drain contact liners and the resulting devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 2A-2I illustrate various illustrative methods disclosed herein for forming an integrated circuit product 200 having transistor devices with different source/drain contact liners. In the illustrated embodiment, the product includes finFET transistor devices, but the techniques described herein are not so limited, and they may be applied to other types of devices, such as planar devices. FIGS. 2A-2I show a cross-sectional view of the product 200 taken through the long axis of one of a first fin 205A formed in a substrate 210 in a first device region 215A and a second fin 205B formed in the substrate 210 in a second device region 215B, with an isolation structure 217 formed therebetween. The cross-sectional view is taken in a direction corresponding to the gate length direction of the product 200. In some cases, the fins 205A, 205B may be portions of the same originally formed fin that extend across both of the device regions 215A, 215B, wherein the originally formed fin is later cut to define the fins 205A, 205B. In other cases, the fins 205A, 205B may each be a part of a different originally formed fin.

Illustrative gate structures 220A, 220B are formed above the fins 205A, 205B. The gate structures 220A, 220B each includes a gate electrode structure 225A, 225B, such as one or more metal layers, and a gate insulation layer (not separately shown), such as silicon dioxide or hafnium oxide. Also depicted are illustrative gate cap layers 230A, 230B and sidewall spacers 235A, 235B, both of which may be made of a material such as silicon nitride. The size and materials of construction for the gate structures 220A, 220B may be the same or different in the different device regions 215A, 215B. In the illustrated embodiment, the gate structure 220A and the fin 215A are for an NMOS device 240A, and the gate structure 220B and the fin 215B are for a PMOS device 240B.

The space between adjacent gate structures 220A defines source/drain contact openings 245A, and the space between adjacent gate structures 220B define source/drain contact openings 245B. The contact openings 245A, 245B expose source/drain regions of the respective fins 205A, 205B.

In the illustrated example, a self-aligned process is employed using the respective gate structures 220A, 220B and spacers 235A, 235B as an etch mask for removing insulating material (not shown) to define the source/drain contact openings 245A, 245B. Additionally, various doped regions, e.g., halo implant regions, well regions and the like, may be formed, but are not depicted in the attached drawings. The substrate 210 may have a variety of configurations, such as the depicted bulk silicon configuration. The substrate 210 may also have a silicon-on-insulator (SOI) configuration that includes a bulk silicon layer, a buried insulation layer and an active layer, wherein semiconductor devices are formed in and above the active layer. The substrate 210 may be formed of silicon or silicon germanium or it may be made of materials other than silicon, such as germanium. Thus, the terms "substrate" or "semiconductor substrate" should be understood to cover all semiconducting materials and all forms of such materials. The substrate 210 may have different layers. For example, the fins 205A, 205B may be formed in a process layer formed above the base layer of the substrate 210.

Figure 2A:
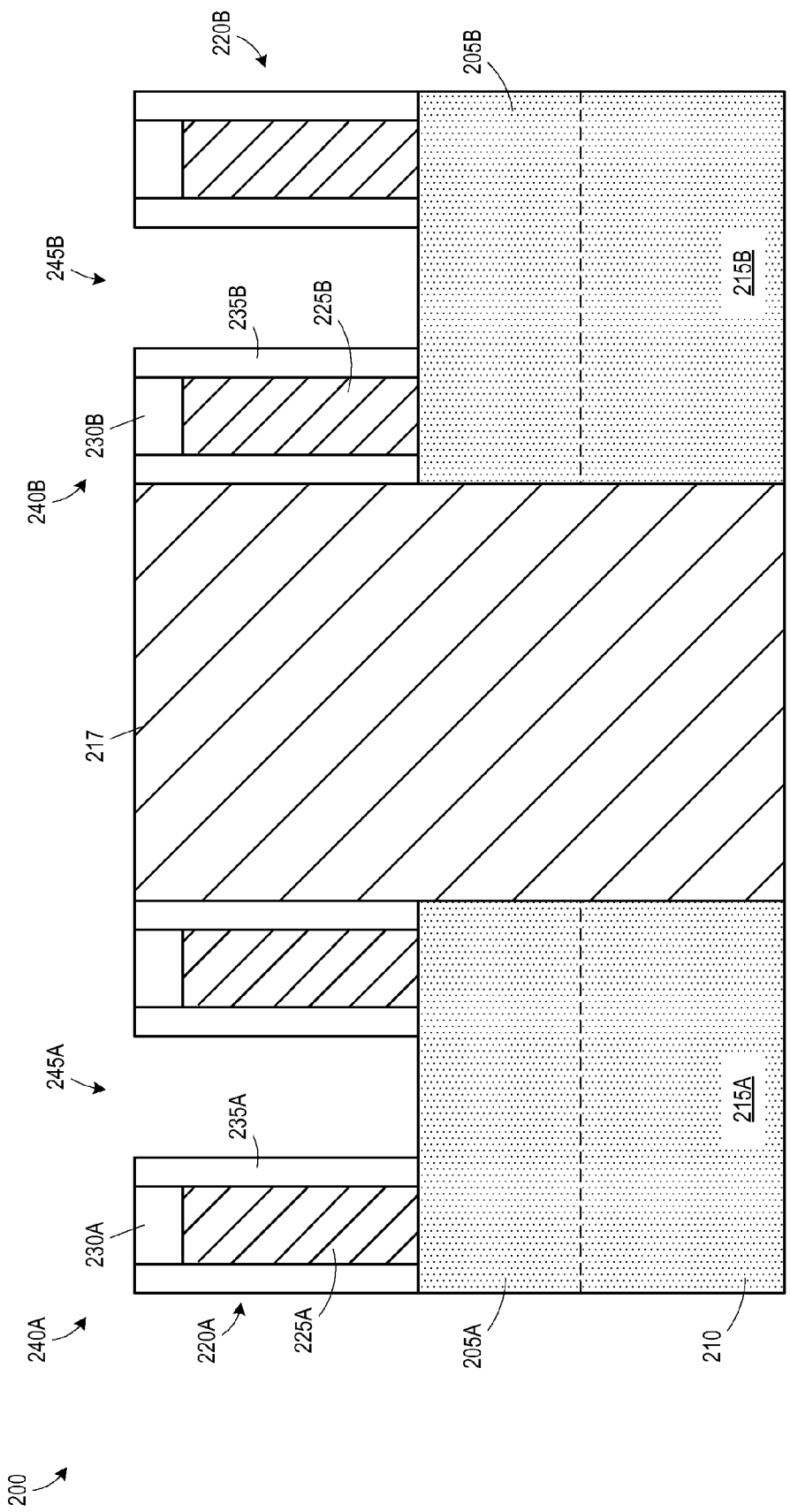
FIGS. 2A-2I depict a method disclosed herein of forming transistor devices with different source/drain contact liners.
Figure 2B:
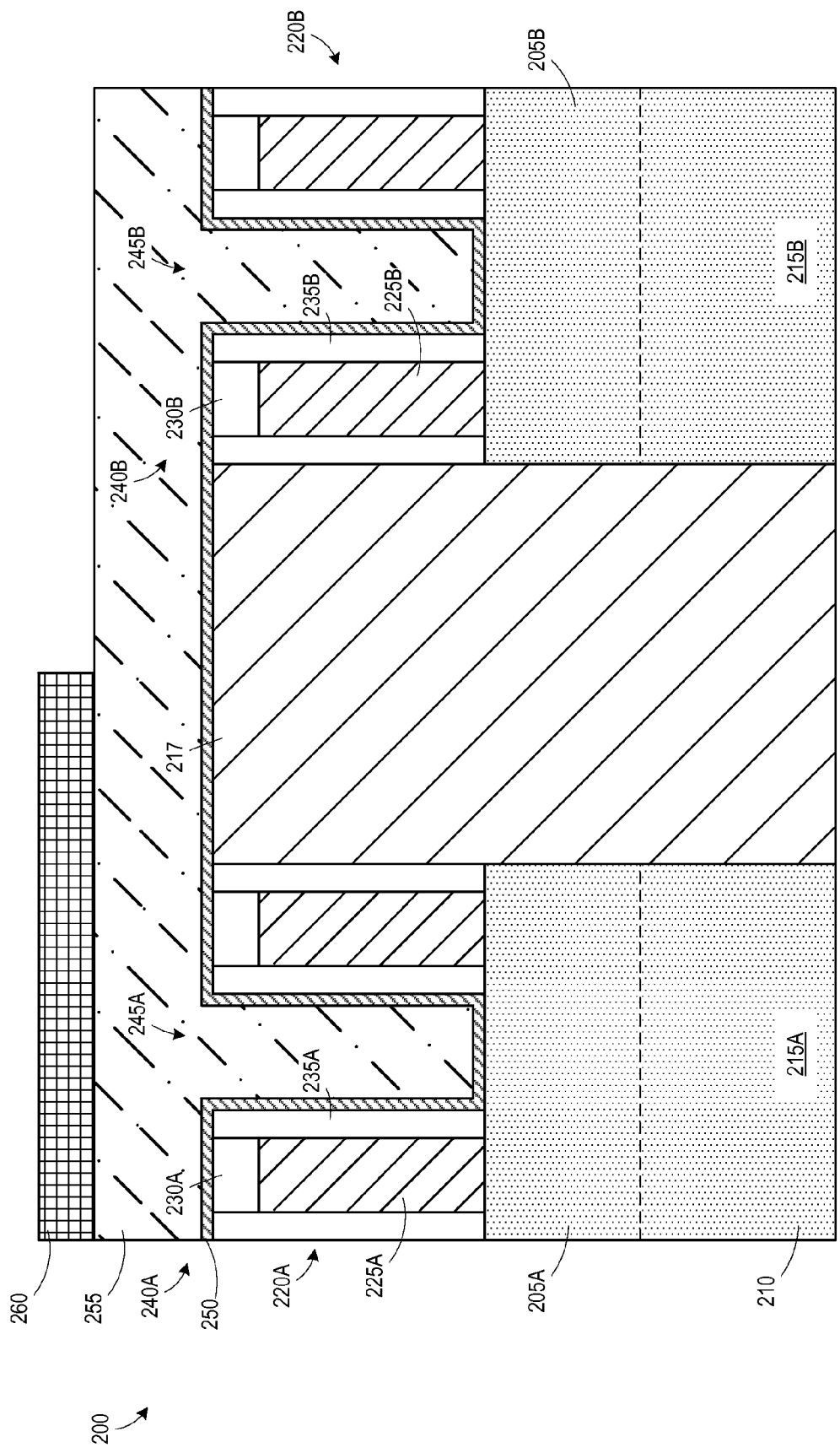

FIG. 2B illustrates the product 200 after a plurality of processes were performed to form a first liner 250 (e.g., Ti, Ta, La, Hf) in the contact openings 245A, 245B, an organic patterning layer (e.g., OPL) 255 above the first liner 250, and a patterned mask layer 260 (e.g., photoresist and anti-reflective coating (ARC) layer) above the OPL layer 255. The mask layer 260 exposes the second device region 215B.

Figure 2C:
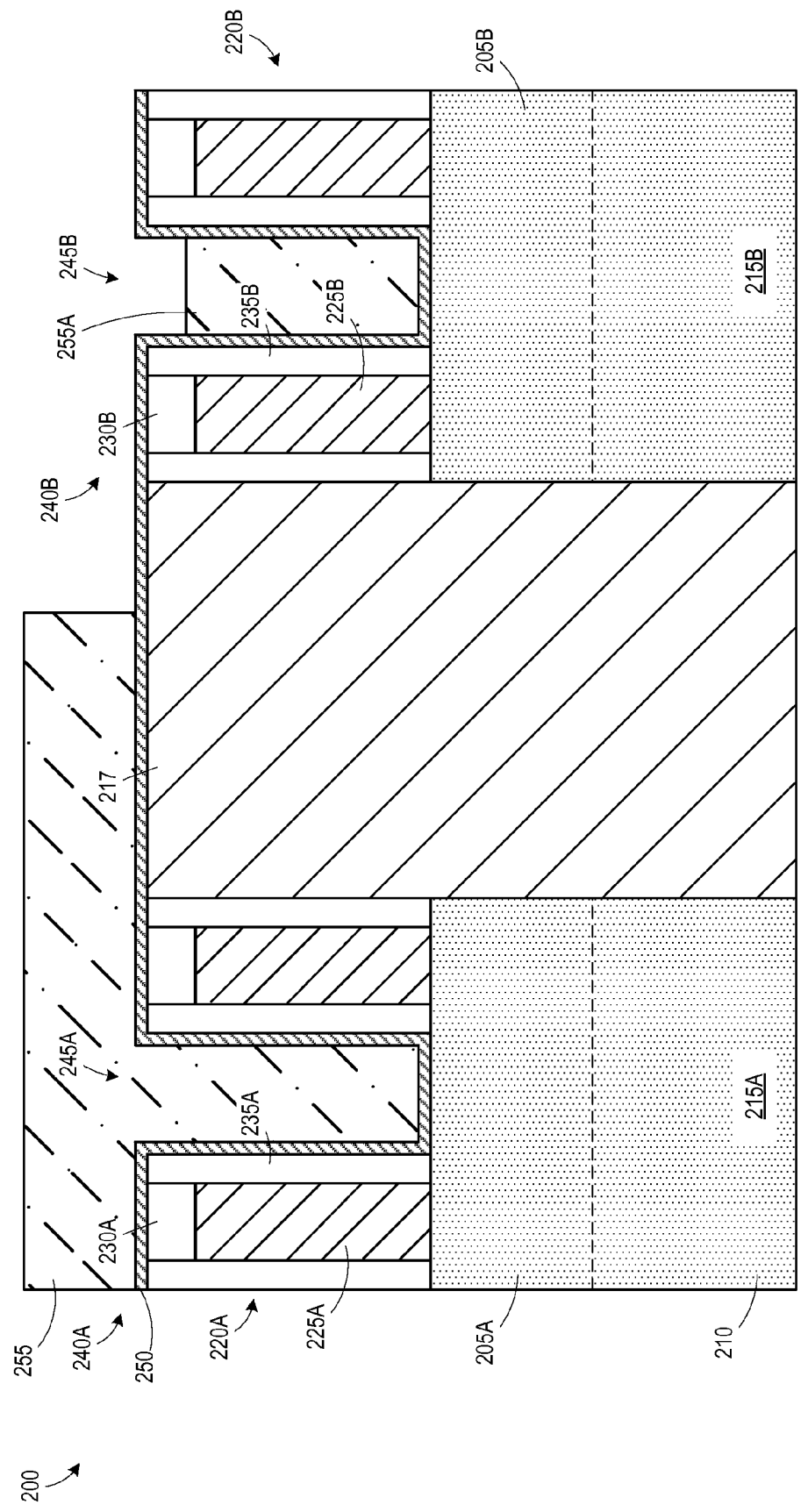

FIG. 2C illustrates the product 200 after one or more etch processes were performed to etch the OPL 255 using the mask layer 260 to define a plug 255A in the contact opening 245B and to remove the mask layer 260.

Figure 2D:
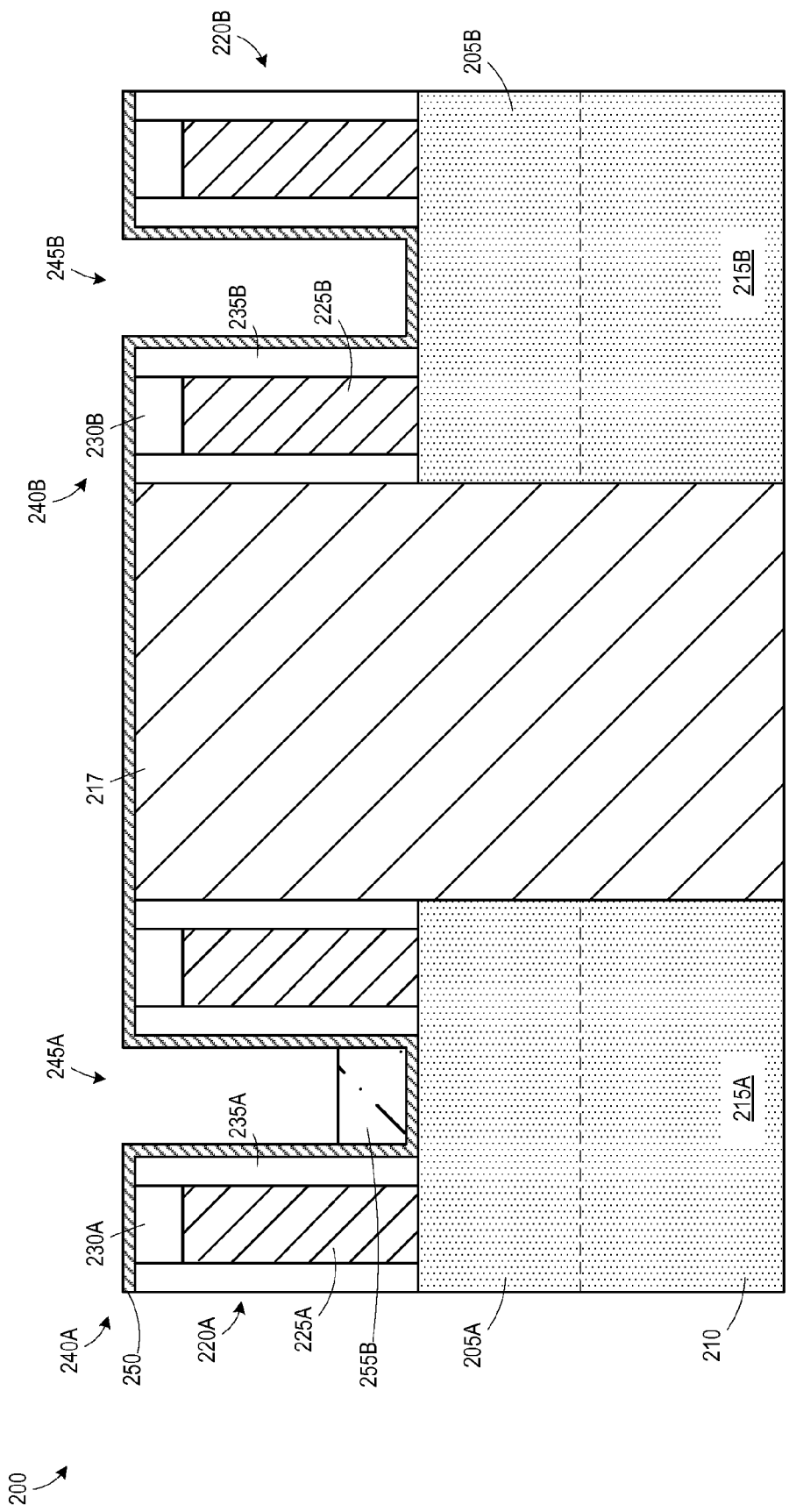

FIG. 2D illustrates the product 200 after a timed etch process (e.g., anisotropic etch) was performed to recess the OPL 255, remove the plug 255A, and to define a plug 255B in the contact opening 245A covering a bottom portion of the liner 250.

Figure 2E:
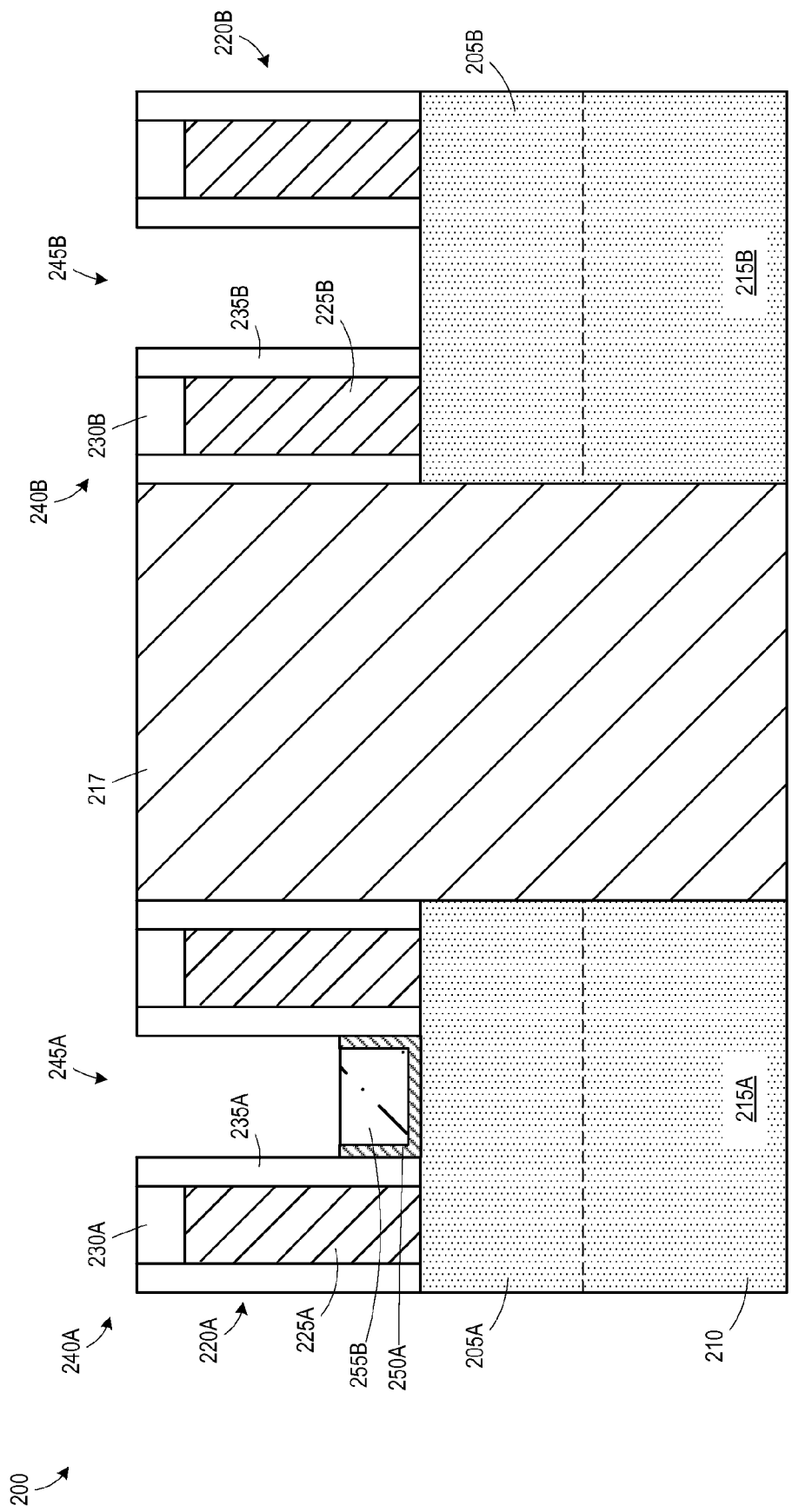

FIG. 2E illustrates the product 200 after an etch process (e.g., wet etch) was performed to remove portions of the liner 250 not covered by the plug 255B, thereby defining a first liner portion 250A that covers a bottom portion of the contact opening 245A and having a height less than a depth of the contact opening 245A (i.e., exposes sidewall portions of the contact opening 245A).

Figure 2F:
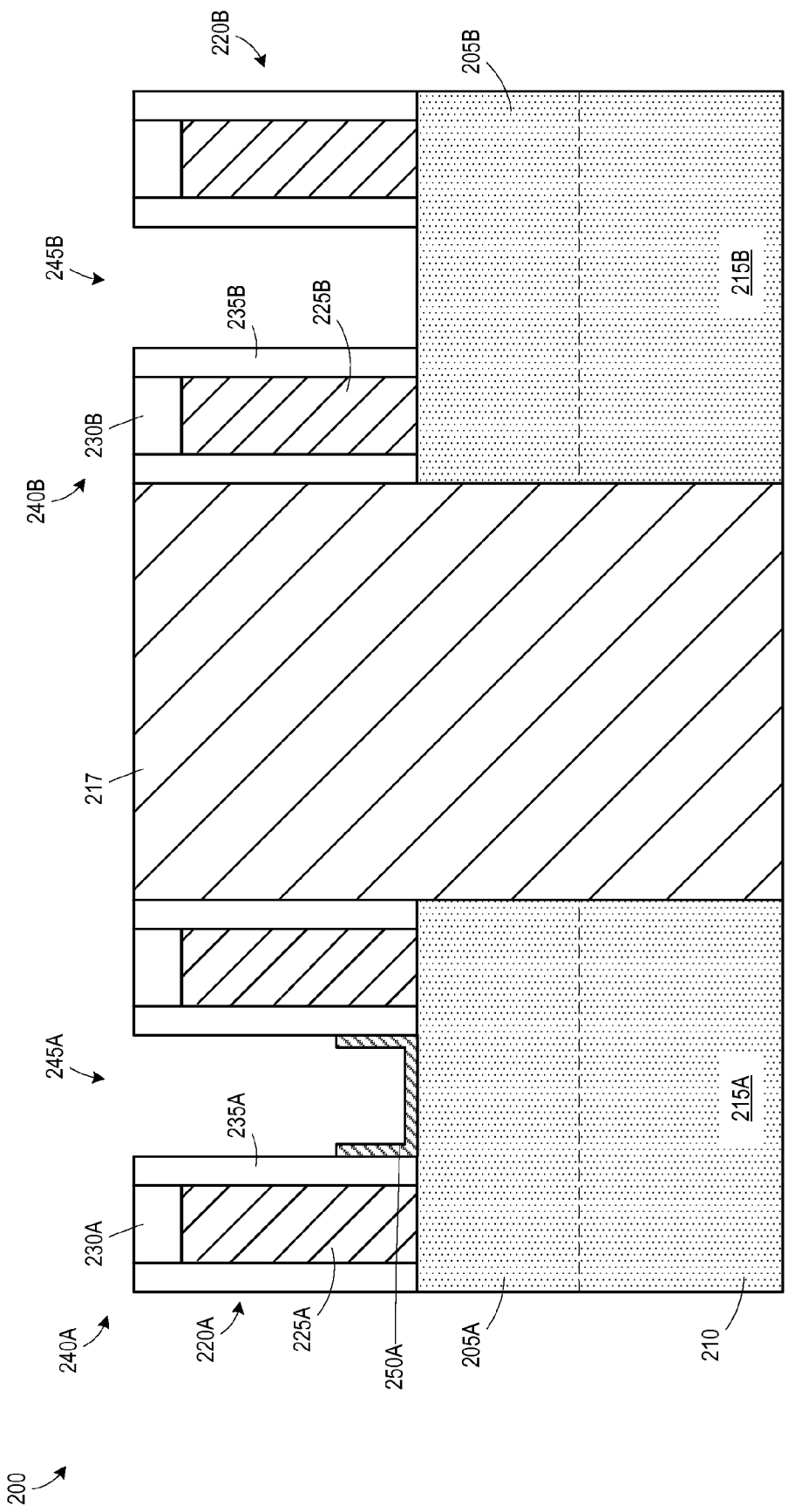

FIG. 2F illustrates the product 200 after an etch process (e.g., wet plasma etch) was performed to remove the plug 255B, thereby leaving the first liner portion 250A exposed in the contact opening 245A.

Figure 2G:
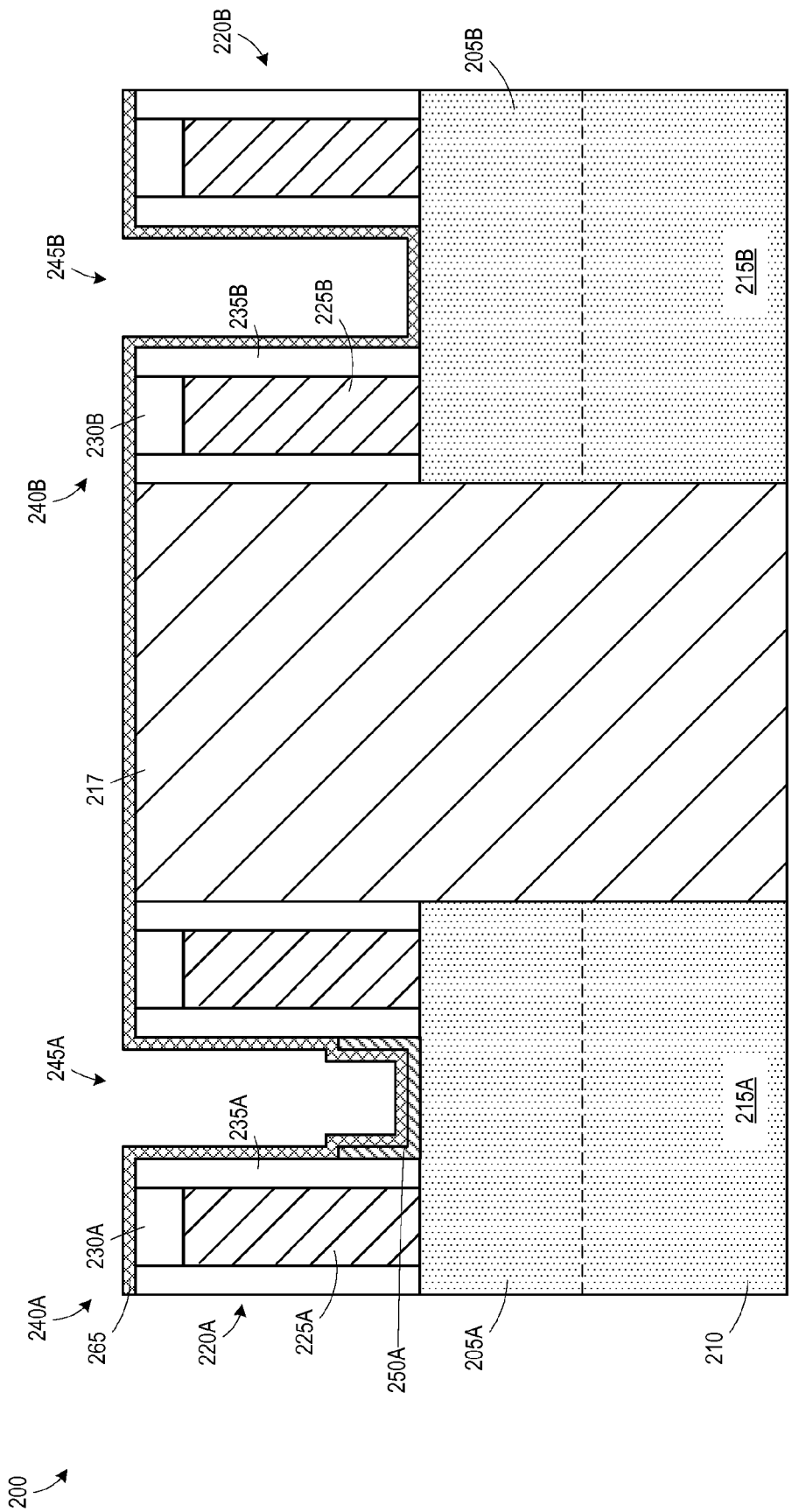

FIG. 2G illustrates the product 200 after a deposition process was performed to form a second liner 265 (e.g., Co, Ru, Ni/Pt) in both of the contact openings 245A, 245B and over the first liner portion 250A.

Figure 2H:
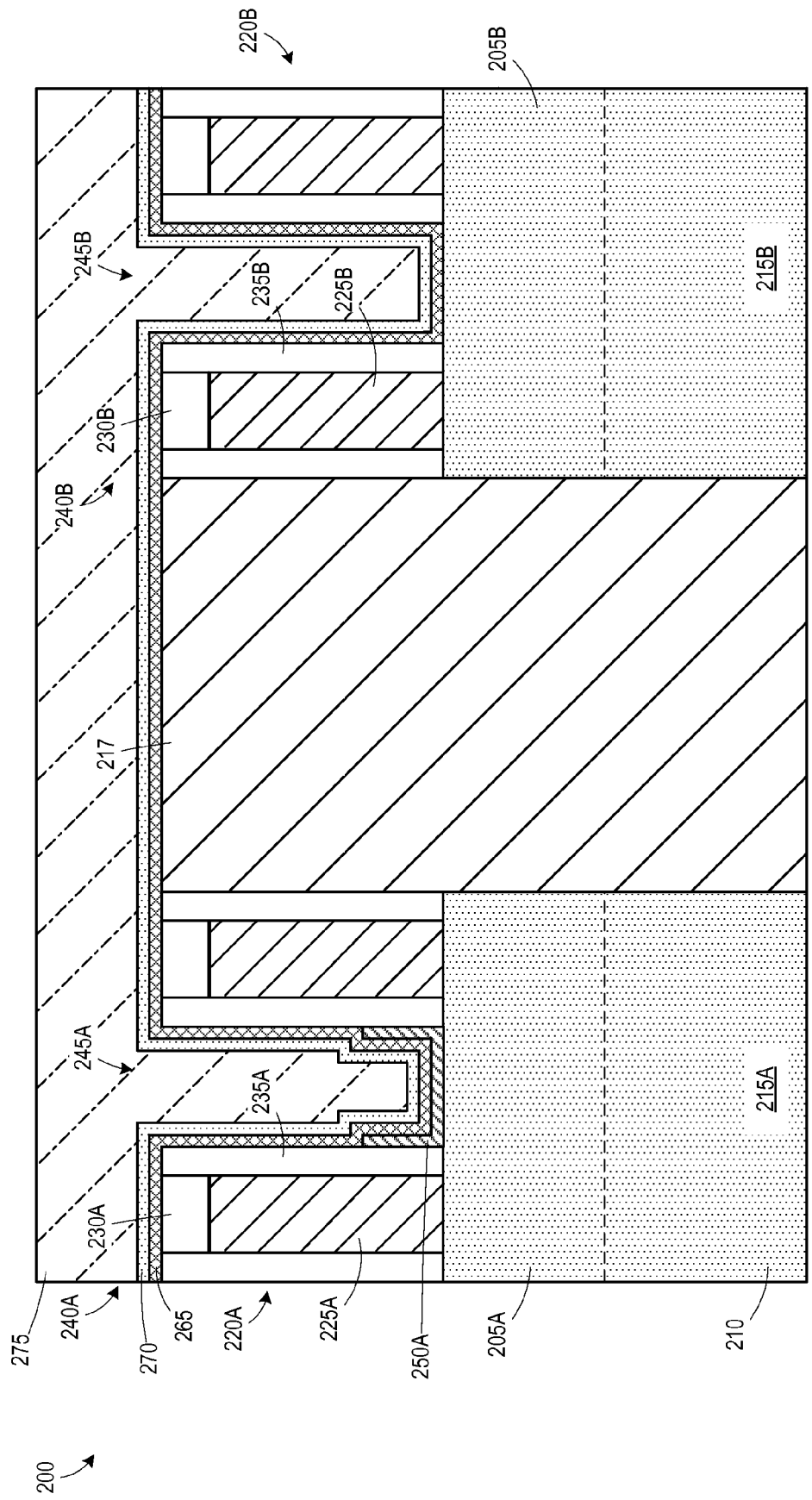

FIG. 2H illustrates the product 200 after a first deposition process was performed to form a barrier layer 270 (e.g., TiN) over the second liner 265 and a second deposition process was performed to form a conductive material 275 (e.g., W) to over fill the contact openings 245A, 245B.

Figure 2I:
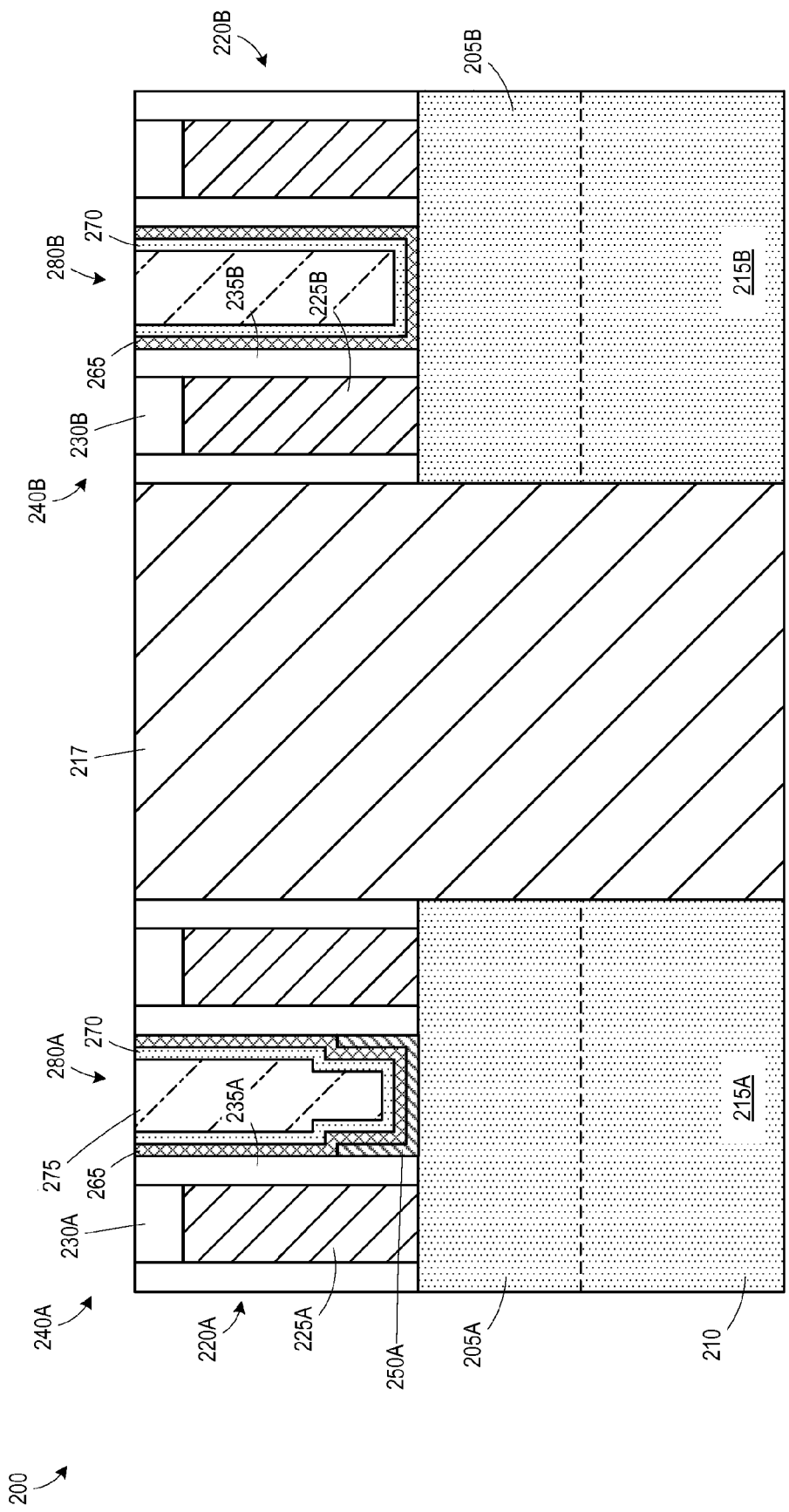

FIG. 2I illustrates the product 200 after a planarization process was performed to remove portions of the layers 265, 270, 275 extending outside the contact openings 245A, 245B. This process results in the definition of contacts 280A, 280B with liners 250A, 265 adapted to the particular transistor conductivity type. The partial removal of the first liner 250 to define the portion 250A reduces the aspect ratio of the contact opening 245A, thereby reducing the likelihood of fill problems for the conductive material 275. Moreover, since the conductive material 275 has a lower resistance than the material of the first liner 250, the partial removal thereof also reduces the overall contact resistance of the contact in the opening 245A as compared to prior art contact structures formed using the prior art technique discussed in the background section of this application.

Although the process was illustrated with the first liner 250 being tailored for the NMOS device 240A, and the second liner 265 being tailored for the PMOS device 240B, in some embodiments, the conductivity types and the materials of the liners 250A, 265 may be reversed.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming first and second contact openings so as to expose first and second source/drain regions, respectively, of a semiconductor material;
    performing at least one process operation to selectively form a first liner only in said first contact opening, wherein said first liner covers a bottom portion of said first contact opening and exposes a sidewall portion of said first contact opening;
    forming a second liner in said first and second contact openings; and
    performing at least one process operation so as to form a conductive material above said second liner to fill said first and second contact openings and define first and second contacts conductively coupled to said first and second source/drain regions, respectively.

2. The method of claim 1, wherein selectively forming said first liner comprises:
    forming said first liner in said first and second contact openings;
    forming a first plug in said first contact opening covering a bottom portion of said first liner;
    removing portions of said first liner not covered by said first plug; and
    removing said first plug.

3. The method of claim 2, further comprising:
    forming a patterning layer in said first and second contact openings above said first liner;
    forming a mask layer above a first portion of said patterning layer positioned above said first contact opening;
    removing a second portion of said patterning layer from said second contact opening to define a second plug in said second contact opening;
    removing said mask layer; and
    etching remaining portions of said patterning layer to remove said second plug from said second contact opening and define said first plug in said first contact opening.

4. The method of claim 1, further comprising:
    forming a barrier layer above said second liner in said first and second contact openings; and
    forming said conductive material above said barrier layer.

5. The method of claim 4, wherein said barrier layer comprises TiN, and said conductive material comprises tungsten.

6. The method of claim 1, wherein said first liner comprises at least one of Ti, Ta, La, or Hf.

7. The method of claim 1, wherein said second liner comprises at least one of Co, Ru, or Ni/Pt.

8. The method of claim 1, wherein said first and second contact openings are each defined between adjacent gate structures.

9. A method, comprising:
    forming first and second contact openings so as to expose first and second source/drain regions, respectively, of a semiconductor material;
    forming a first liner in said first and second contact openings;
    removing said first liner from said second contact opening and removing a top portion of said first liner from said first contact opening to define a remainder portion of said first liner covering a bottom portion of said first contact opening;

forming a second liner in said first and second contact openings, wherein said second liner is disposed above said remainder portion of said first liner in said first contact opening; and forming a conductive material above said second liner to fill said first and second contact openings and define first and second contacts conductively coupled to said first and second source/drain regions, respectively.

10. The method of claim 9, further comprising:

forming a patterning layer in said first and second contact openings above said first liner prior to defining said remainder portion;

forming a mask layer above a first portion of said patterning layer positioned above said first contact opening;

removing a second portion of said patterning layer from said second contact opening to define a first plug in said second contact opening;

removing said mask layer;

performing an etching process to remove said first plug from said second contact opening and to recess said first portion to define a second plug in said first contact opening;

removing portions of said first liner not covered by said second plug to define said remainder portion; and removing said second plug.

11. The method of claim 9, further comprising:

forming a barrier layer above said second liner in said first and second contact openings; and forming said conductive material above said barrier layer.

12. The method of claim 11, wherein said barrier layer comprises TiN, and said conductive material comprises tungsten.

13. The method of claim 9, wherein said first liner comprises at least one of Ti, Ta, La, or Hf.

14. The method of claim 9, wherein said second liner comprises at least one of Co, Ru, or Ni/Pt.

15. The method of claim 9, wherein said first and second contact openings are each defined between adjacent gate structures.

16. A device, comprising:

a first contact conductively coupled to a first source/drain region, wherein said first contact comprises a first liner disposed above said first source/drain region and having a height less than a height of said first contact, a first portion of a second liner disposed above said first liner, and a first portion of a conductive material disposed above said first portion of said second liner; and a second contact conductively coupled to a second source/drain region, wherein said second contact comprises a second portion of said second liner disposed above said second source/drain region and a second portion of said conductive material disposed above said second portion of said second liner.

17. The device of claim 16, wherein said first contact comprises a first portion of a barrier layer disposed between said first portion of said second liner and said first portion of said conductive material, and said second contact comprises a second portion of said barrier layer disposed between said second portion of said second liner and said second portion of said conductive material.

18. The device of claim 17, wherein said barrier layer comprises TiN, and said conductive material comprises tungsten.

19. The device of claim 17, wherein said first liner comprises at least one of Ti, Ta, La, or Hf and said second liner comprises at least one of Co, Ru, or Ni/Pt.

20. The device of claim 16, further comprising:

a first pair of adjacent gate structures between which said first contact is disposed; and a second pair of adjacent gate structures between which said second contact is disposed.

* * * * *